(12) United States Patent
Monden et al.

(10) Patent No.: US 9,209,637 B2
(45) Date of Patent: Dec. 8, 2015

(54) BATTERY CONTROL APPARATUS

(71) Applicant: Kabushiki Kaisha Toshiba, Tokyo (JP)

(72) Inventors: Yukitaka Monden, Kawasaki (JP); Yuji Okita, Tokyo (JP); Mami Mizutani, Hachioji (JP); Satoru Amaki, Fuchu (JP); Yuusuke Yamashita, Kawasaki (JP); Susumu Nishida, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 377 days.

(21) Appl. No.: 13/836,434

(22) Filed: Mar. 15, 2013

(65) Prior Publication Data

US 2015/0162771 A1    Jun. 11, 2015

(51) Int. Cl.
*H02J 7/00* (2006.01)
*G01R 31/36* (2006.01)
*G01K 13/00* (2006.01)
*H01M 10/48* (2006.01)

(52) U.S. Cl.
CPC ............... *H02J 7/0054* (2013.01); *G01K 13/00* (2013.01); *G01R 31/362* (2013.01); *H01M 10/486* (2013.01); *H02J 7/007* (2013.01)

(58) Field of Classification Search
CPC ........................... B06L 11/1866; H02J 7/0068
USPC ................... 320/103, 124, 127, 128
See application file for complete search history.

(56) References Cited

U.S. PATENT DOCUMENTS

| | | | |
|---|---|---|---|
| 2004/0251870 A1* | 12/2004 | Ueda et al. | 320/104 |
| 2006/0113964 A1* | 6/2006 | Ito et al. | 320/150 |
| 2008/0122399 A1* | 5/2008 | Nishino et al. | 320/103 |
| 2010/0001693 A1* | 1/2010 | Iida et al. | 320/134 |
| 2011/0127958 A1* | 6/2011 | Ishishita et al. | 320/109 |
| 2012/0206107 A1* | 8/2012 | Ono et al. | 320/136 |
| 2012/0262109 A1 | 10/2012 | Toya et al. | |
| 2012/0306432 A1 | 12/2012 | Xu et al. | |

FOREIGN PATENT DOCUMENTS

| | | |
|---|---|---|
| EP | 2 290 731 A1 | 3/2011 |
| JP | 2003-272712 | 9/2003 |
| JP | 2007-12568 | 1/2007 |

(Continued)

OTHER PUBLICATIONS

Extended European Search Report issued Apr. 1, 2014 in Patent Application No. 13160031.4.

*Primary Examiner* — Paul Dinh
(74) *Attorney, Agent, or Firm* — Oblon, McClelland, Maier & Neustadt, L.L.P.

(57) ABSTRACT

According to one embodiment, a secondary battery control apparatus includes a charger/discharger and a charge/discharge controller. The charger/discharger connects a plurality of secondary batteries, and charges one secondary battery by electric power discharged by another secondary battery. The charge/discharge controller controls the charger/discharger such that charging and discharging are performed between the plurality of secondary batteries by using the charger/discharger if battery temperature information detected by temperature detector is lower than a preset threshold temperature, wherein the charging is stopped and switched to discharging or pause if voltage information detected by the voltage detector reaches the upper limit voltage of the secondary battery, and the discharging is stopped and switched to charging or pause if the voltage information detected by the voltage detector reaches the lower limit voltage of the secondary battery.

9 Claims, 9 Drawing Sheets

(56) References Cited

FOREIGN PATENT DOCUMENTS

| | | |
|---|---|---|
| JP | 2008-236991 A | 10/2008 |
| JP | 2010-093871 A | 4/2010 |
| JP | 2010-093883 A | 4/2010 |
| JP | 2010-093969 A | 4/2010 |
| JP | 2011-076927 A | 4/2011 |
| JP | 2011-109802 A | 6/2011 |

* cited by examiner

BATTERY CONTROL APPARATUS

FIELD

Embodiments described herein relate generally to a secondary battery control apparatus for raising the temperature of a secondary battery within a short time period.

BACKGROUND

In secondary battery charging and discharging operations, the impedance of the secondary battery increases in a low-temperature environment, so electric power or an energy amount that can be charged and discharged at normal temperature cannot be obtained in a low-temperature environment. To solve this problem, a method of raising the temperature of a secondary battery by using a heater installed outside the battery is adopted. However, the heater produces a power loss, and it is impossible to evenly raise the temperature within a short time outside and inside the secondary battery.

DETAILED DESCRIPTION

In general, according to one embodiment, a secondary battery control apparatus for controlling a plurality of secondary batteries includes a voltage detector, a temperature detector, a charger/discharger, and a charge/discharge controller. The voltage detector detects voltages of the secondary battery and one or more cells of the secondary battery. The temperature detector detects a temperature of the secondary battery. The charger/discharger connects the plurality of secondary batteries, and charges one secondary battery by electric power discharged by another secondary battery. The charge/discharge controller controls the charger/discharger such that charging and discharging are performed between the plurality of secondary batteries by using the charger/discharger if battery temperature information detected by the temperature detector is lower than a preset threshold temperature, wherein the charging is stopped and switched to discharging or pause if voltage information detected by the voltage detector reaches the upper limit voltage of the secondary battery, and the discharging is stopped and switched to charging or pause if the voltage information detected by the voltage detector reaches the lower limit voltage of the secondary battery.

The secondary battery control apparatus according to this embodiment will be explained below with reference to the accompanying drawings.

First Embodiment

Figure 1:
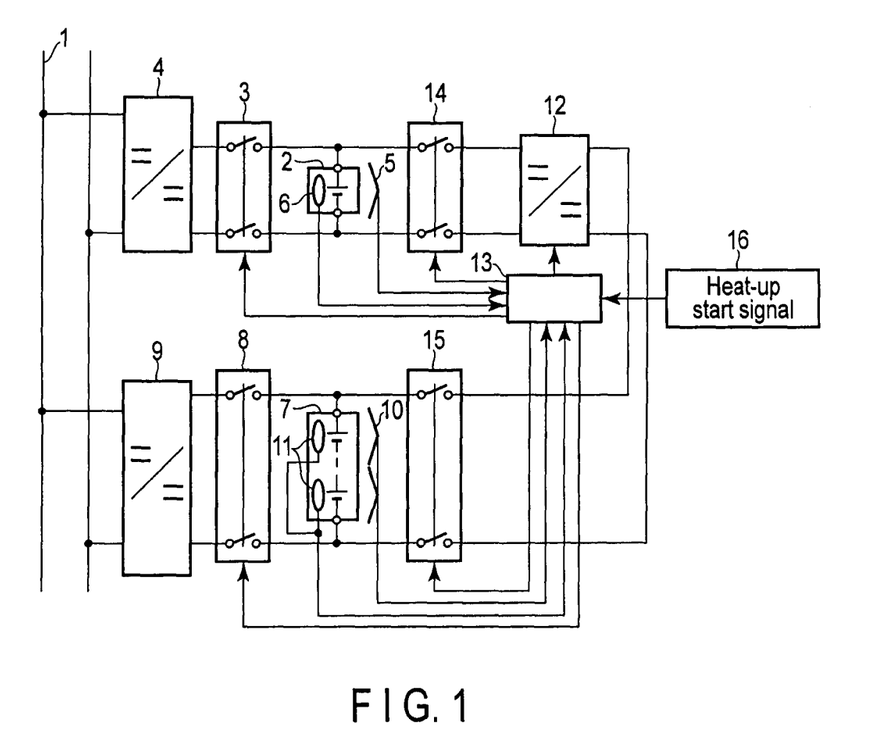
FIG. 1 is a view showing the arrangement of a secondary battery control apparatus according to the first embodiment.

FIG. 1 is a view showing the arrangement of a secondary battery control apparatus according to the first embodiment. Referring to FIG. 1, this apparatus includes a DC bus 1, a secondary battery 2, a switching unit 3, a DC/DC converter 4 for performing charging/discharging of electric power of the secondary battery 2 with respect to the DC bus 1, a voltage detector 5 for detecting the voltages of the secondary battery 2 and one or more cells of the secondary battery 2, a battery temperature detector 6 for detecting the temperature of the secondary battery 2, at least one secondary battery 7 different from the secondary battery 2, a switching unit 8, a DC/DC converter 9 for performing charging/discharging of electric power of the secondary battery 7 with respect to the DC bus 1, a voltage detector 10 for detecting the voltages of the secondary battery 7 and one or more cells of the secondary battery 7, a battery temperature detector 11 for detecting the temperature of the secondary battery 7, a charger/discharger 12 for performing charging/discharging between the secondary batteries 2 and 7, a charge/discharge controller 13 for controlling the charger/discharger 12, the switching units 3 and 8, and switching units 14 and 15, the switching unit 14 for disconnecting the charger/discharger 12 from the secondary battery 2, the switching unit 15 for disconnecting the charger/discharger 12 from the secondary battery 7, and a heat-up start signal 16.

The secondary battery 2 is connected to the DC bus 1 via the switching unit 3 and DC/DC converter 4. In a normal battery use, the switching unit 3 is turned on, and the DC/DC converter 4 controls charging and discharging of the secondary battery 2. Similarly, the secondary battery 7 is connected to the DC bus 1 via the switching unit 8 and DC/DC converter 9. In a normal battery use, the switching unit 8 is turned on, and the DC/DC converter 9 controls charging and discharging of the secondary battery 7.

The charger/discharger 12 is connected to the secondary battery 2 via the switching unit 14, and connected to the secondary battery 7 via the switching unit 15. The charge/discharge controller 13 for controlling the charger/discharger 12 receives voltage information of the secondary battery 2 which is detected by the voltage detector 5 and battery temperature information detected by the battery temperature detector 6, and also receives voltage information of the secondary battery 7 which is detected by the voltage detector 10 and battery temperature information detected by the battery temperature detector 11.

When the heat-up start signal 16 is input to the charge/discharge controller 13, the charge/discharge controller 13 compares the battery temperature information detected by the battery temperature detector 6 and the battery temperature information detected by the battery temperature detector 11 with a preset low threshold temperature. If the battery temperature information is lower than the low threshold temperature, the charge/discharge controller 13 turns off the switching units 3 and 8 and turns on the switching units 14 and 15, thereby disconnecting the secondary batteries 2 and 7 from the DC bus 1 and connecting them to the charger/discharger 12.

Figure 2:
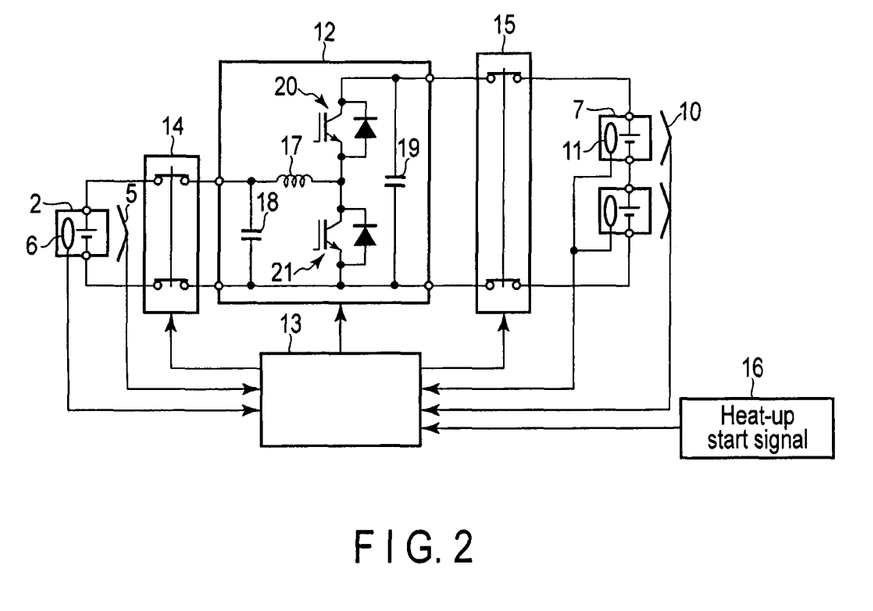
FIG. 2 is a view showing a configuration example of a charge/discharge controller.

FIG. 2 shows an example of the circuit configuration of the charger/discharger 12. The charger/discharger 12 includes a reactor 17, capacitors 18 and 19, and semiconductor elements 20 and 21. The same reference numerals as in FIG. 1 denote the same parts in FIG. 2, and a repetitive explanation will be omitted.

When viewed from the secondary battery 2, the charger/discharger 12 includes the semiconductor element 20 for charging the secondary battery 2, and the semiconductor element 21 for discharging the secondary battery 2, and the reactor 17 has a function of storing energy generated by charging/discharging. Also, the capacitor 18 is connected to the secondary battery 2 side of the charger/discharger 12, and the capacitor 19 is connected to the secondary battery 7 side of the charger/discharger 12, thereby reducing current ripples produced in the secondary batteries 2 and 7. Note that when the capacitors 18 and 19 are used, an inrush current sometimes flows from the secondary battery to the capacitor when the switching unit 14 or 15 is turned on. If this inrush current is excessive, the switching unit or the like may be damaged. Therefore, the charger/discharger 12 may also include an inrush current preventing circuit that is a series circuit including a switching unit and resistor and formed in parallel to the switching units 14 and 15. In this mechanism, the capacitors 18 and 19 are precharged by turning on the inrush current preventing circuit before the switching units 14 and 15 are turned on, and then the switching units 14 and 15 are turned on.

The charge/discharge controller 13 generates a charge/discharge control signal based on the heat-up start signal 16 and the battery temperature information detected by the battery temperature detectors 6 and 11, and outputs the charge/discharge control signal to the charger/discharger 12. In accordance with this charge/discharge control signal from the charge/discharge controller 13, the charger/discharger 12 turns on and off the semiconductor element 20 to charge the secondary battery 2 and discharge the secondary battery 7, thereby exchanging electric power. Also, the charger/discharger 12 turns on and off the semiconductor element 21 to discharge the secondary battery 2 and charge the secondary battery 7, thereby exchanging electric power. If the secondary battery 2 is continuously charged or discharged, the electric power of the secondary battery reaches the upper or lower limit voltage of the battery soon, and the battery cannot be charged or discharged any more. Therefore, the charge/discharge controller 13 receives the voltage information detected by the voltage detector 5 and the voltage information detected by the voltage detector 10, stops charging and switches to discharging or pause if these pieces of voltage information reach the upper limit voltage of the secondary battery 2 or 7, and stops discharging and switches to charging or pause if these pieces of voltage information reach the lower limit voltage of the secondary battery 2 or 7.

Figure 3:
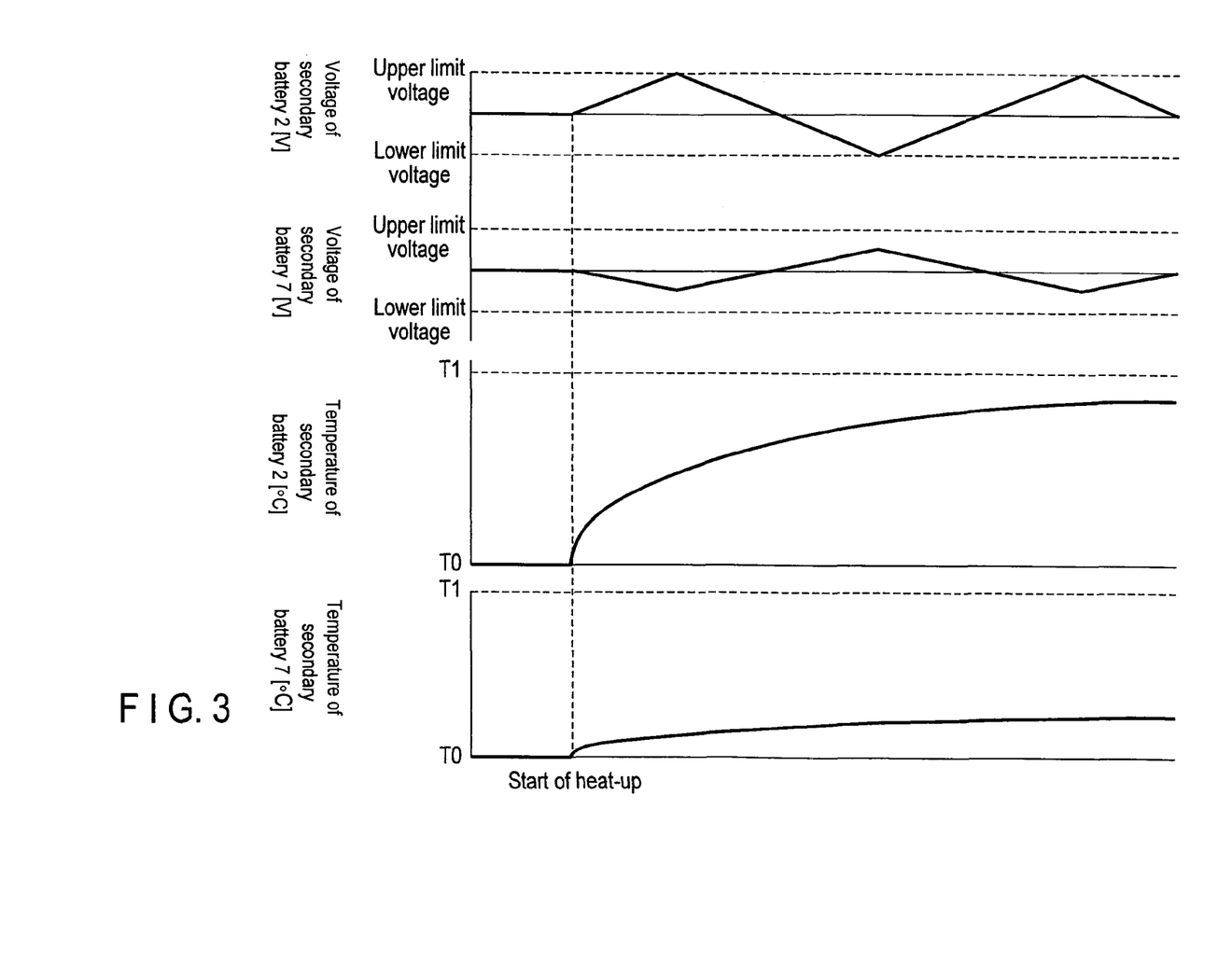
FIG. 3 is a view showing a heat-up operation pattern of the charge/discharge controller.

FIG. 3 shows an example of a heat-up operation pattern of the charge/discharge controller 13. When receiving the heat-up start signal, the charge/discharge controller 13 starts a heat-up operation if a temperature T0 of the secondary batteries 2 and 7 is lower than a low threshold temperature. For example, the charge/discharge controller 13 first starts charging the secondary battery 2 and discharging the secondary battery 7. When the voltage information detected by the voltage detector 5 reaches the upper limit voltage or the voltage information detected by the voltage detector 10 reaches the lower limit voltage, the charge/discharge controller 13 switches to discharging of the secondary battery 2 and charging of the secondary battery 7. When the voltage information detected by the voltage detector 5 reaches the lower limit voltage or the voltage information detected by the voltage detector 10 reaches the higher limit voltage after that, the charge/discharge controller 13 switches to charging of the secondary battery 2 and discharging of the secondary battery 7 again. When the secondary battery 2 or 7 reaches a target temperature T1, the charge/discharge controller 13 stops the heat-up operation.

In the first embodiment as described above, if the impedance of a secondary battery rises in a low-temperature environment, a large current is charged and discharged between this secondary battery and another secondary battery. This makes it possible to raise the temperature of the battery within a short time period without any power loss. Consequently, it is possible to reduce the impedance of the secondary battery, and improve the output power and energy amount.

Second Embodiment

Figure 4:
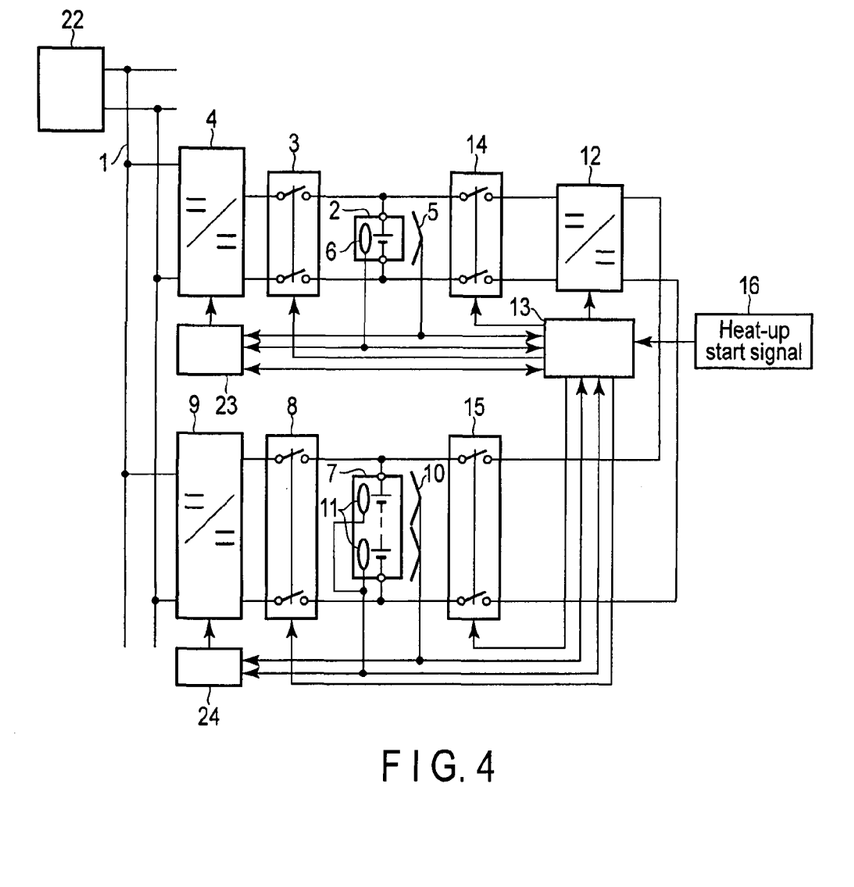
FIG. 4 is a view showing the arrangement of a secondary battery control apparatus according to the second embodiment.

FIG. 4 is a view showing the arrangement of a secondary battery control apparatus according to the second embodiment. The second embodiment is obtained by further adding a power supply unit 22, a controller 23 for controlling a DC/DC converter 4, and a controller 24 for controlling a DC/DC converter 9 to the arrangement shown in FIG. 1. Note that the power supply unit 22 can be a commercial power supply or dispersed power supply, and can also be a generator. The same reference numerals as in FIG. 1 denote the same parts in FIG. 4, and a repetitive explanation will be omitted.

The power supply unit 22 is connected to a secondary battery 2 via the DC/DC converter 4. Under the control of the controller 23, the power supply unit 22 can drive the DC/DC converter 4 and move electric power generated by the power supply unit 22 to the secondary battery 2, thereby charging it. Similarly, the power supply unit 22 is connected to a secondary battery 7 via the DC/DC converter 9, and, under the control of the controller 24, can drive the DC/DC converter 9 and move electric power generated by the power supply unit 22 to the secondary battery 7, thereby charging it.

The controller 23 for controlling the DC/DC converter 4 includes a state-of-charge determination unit for determining the state of charge of the secondary battery 2. The state-of-charge determination unit estimates the residual energy amount (SOC: State of Charge) of the secondary battery 2 from voltage information detected by a voltage detector 5 of the secondary battery 2 and battery temperature information detected by a battery temperature detector 6, and generates state-of-charge information. This state-of-charge information generated by the controller 23 is transmitted to a charge/discharge controller 13. If the state-of-charge information is lower than a preset threshold, the charge/discharge controller 13 drives the DC/DC converter 4 by the controller 23 to move electric power generated by the power supply unit 22 to the secondary battery 2, thereby charging it.

The controller 24 for controlling the DC/DC converter 9 includes a state-of-charge determination unit for determining the state of charge of the secondary battery 7. The state-of-charge determination unit estimates the residual energy amount (SOC) of the secondary battery 7 from voltage information detected by a voltage detector 10 of the secondary battery 7 and battery temperature information detected by a battery temperature detector 11, and generates state-of-charge information. If this state-of-charge information transmitted from the controller 24 is lower than a preset threshold, the charge/discharge controller 13 drives the DC/DC converter 9 to move electric power generated by the power supply unit 22 to the secondary battery 7, thereby charging it.

In the second embodiment as described above, when raising the temperatures of the secondary batteries 2 and 7 by performing charging/discharging between them by using a charger/discharger 12, if the energies of the secondary batteries 2 and 7 are low, it is possible to store energy sufficient for a discharging operation by precharging the secondary batteries.

Third Embodiment

Figure 5:
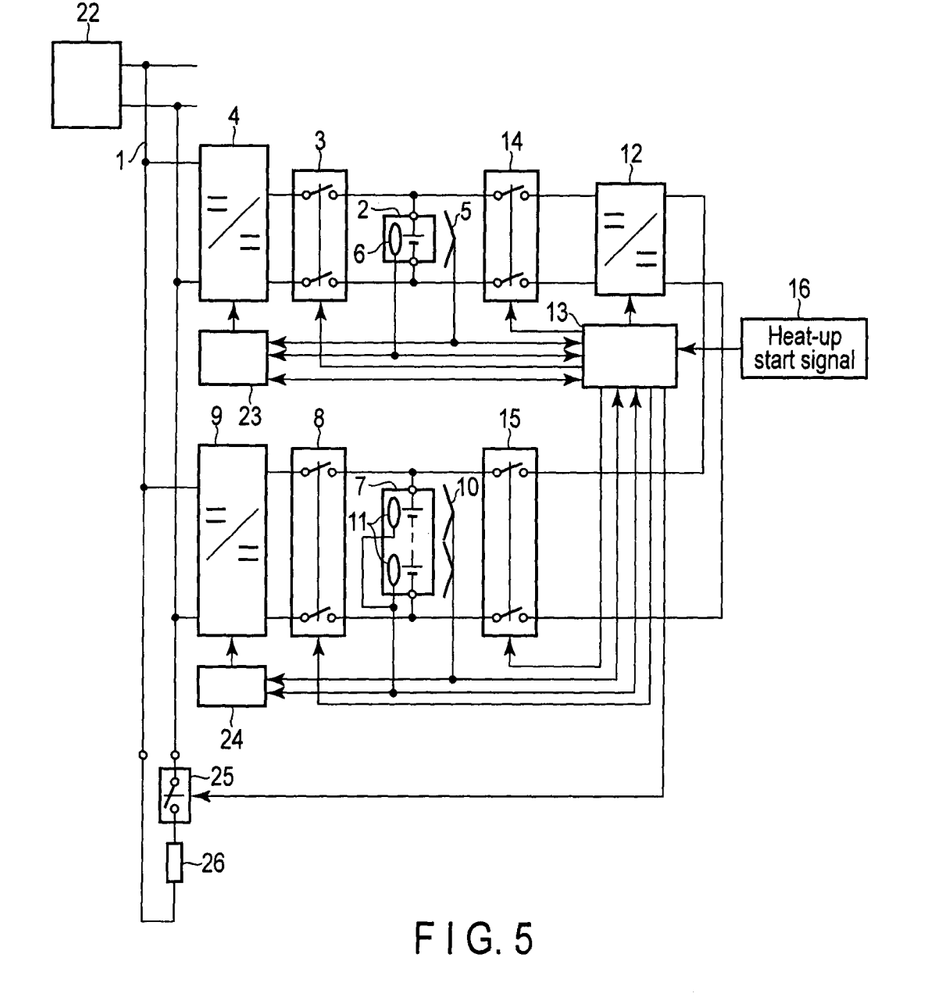
FIG. 5 is a view showing the arrangement of a secondary battery control apparatus according to the third embodiment.

FIG. 5 is a view showing the arrangement of a secondary battery control apparatus according to the third embodiment. In the third embodiment, a switching unit 25 and power consuming unit 26 are added to the arrangement shown in FIG. 4. The power consuming unit 26 can also be a loading device such as resistor or motor. The same reference numerals as in FIG. 4 denote the same parts in FIG. 5, and a repetitive explanation will be omitted.

The power consuming unit 26 is connected to a DC bus 1 via the switching unit 25. A controller 23 for controlling a DC/DC converter 4 includes a state-of-charge determination unit for determining the state of charge of a secondary battery 2. The state-of-charge determination unit estimates the residual energy amount (SOC) of the secondary battery 2 from voltage information detected by a voltage detector 5 of the secondary battery 2 and battery temperature information detected by a battery temperature detector 6, and generates state-of-charge information. If this state-of-charge information transmitted from the controller 23 is higher than a preset threshold, a charge/discharge controller 13 turns on the switching unit 25 to connect the power consuming unit 26 to the DC bus 1, thereby securing a power consumption destination. In addition, the charge/discharge controller 13 drives the DC/DC converter 4 by the controller 23 and performs discharging so that the power consuming unit 26 consumes electric power of the secondary battery 2.

Also, a controller 24 for controlling a DC/DC converter 9 includes a state-of-charge determination unit for determining the state of charge of a secondary battery 7. The state-of-charge determination unit estimates the residual energy amount (SOC) of the secondary battery 7 from voltage information detected by a voltage detector 10 of the secondary battery 7 and battery temperature information detected by a battery temperature detector 11, and generates state-of-charge information. If this state-of-charge information transmitted from the controller 24 is higher than a preset threshold, the charge/discharge controller 13 turns on the switching unit 25 to connect the power consuming unit 26 to the DC bus 1, thereby securing a power consumption destination. In addition, the charge/discharge controller 13 drives the DC/DC converter 9 by the controller 24 and performs discharging so that the power consuming unit 26 consumes electric power of the secondary battery 7.

In the third embodiment as described above, when raising the temperatures of the secondary batteries 2 and 7 by performing charging/discharging between them by using a charger/discharger 12, if the energies of the secondary batteries 2 and 7 are high, it is possible to discharge the secondary batteries beforehand to give them a margin to store energy with respect to a charging operation.

Fourth Embodiment

Figure 6:
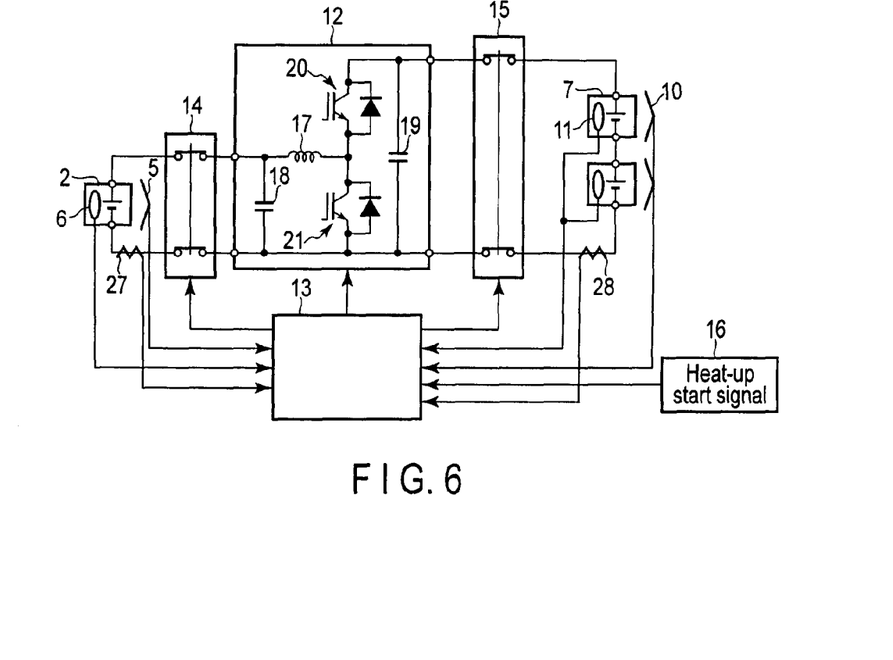
FIG. 6 is a view showing the arrangement of a secondary battery control apparatus according to the fourth embodiment.
Figure 7:
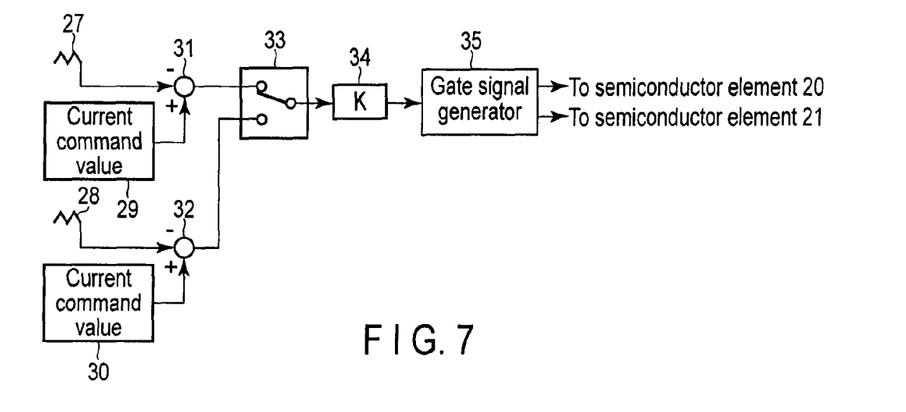
FIG. 7 is a view showing an example of the control of a charge/discharge controller.

FIG. 6 is a view showing the arrangement of a secondary battery control apparatus according to the fourth embodiment. The fourth embodiment is obtained by adding a current detector 27 for measuring the charge/discharge current of a secondary battery 2 and a current detector 28 for measuring the charge/discharge current of a secondary battery 7 to the arrangement shown in FIG. 2. FIG. 7 is a view showing an example of the control of a charge/discharge controller 13 in the arrangement shown in FIG. 6. As shown in FIG. 7, the charge/discharge controller 13 includes a current command value 29 for controlling the charge/discharge current of the secondary battery 2, a current command value 30 for controlling the charge/discharge current of the secondary battery 7, adders 31 and 32, a switching unit 33 for switching pieces of current information to be controlled, a control gain 34, and a gate signal generator 35 for generating gate signals for turning on and off semiconductor elements 20 and 21. Note that the current command values 29 and 30 are preset in the fourth embodiment.

The operation of the fourth embodiment will be explained with reference to FIGS. 6 and 7. The current detector 27 measures the charge/discharge current of the secondary battery 2, and outputs current information to the adder 31. The adder 31 receives the current command value 29 for controlling the charge/discharge current of the secondary battery 2 and the current information detected by the current detector 27, and obtains a deviation between them. Also, the current detector 28 measures the charge/discharge current of the secondary battery 7, and outputs current information to the adder 32. The adder 32 receives the current command value 30 for controlling the charge/discharge current of the secondary battery 7 and the current information detected by the current detector 28, and obtains a deviation between them.

The switching unit 33 performs switching in accordance with a secondary battery to be controlled by a charger/discharger 12, and outputs, to the control gain 34, current deviation information obtained from the current information and current command value of the secondary battery to be controlled. The current deviation information is gained by the control gain 34, and supplied to the gate signal generator 35. The gate signal generator 35 generates signals for driving the semiconductor elements 20 and 21, and outputs the signals to the semiconductor elements 20 and 21.

That is, in the fourth embodiment, the deviation between the current information detected by the current detector 27 and the preset current command value is obtained, and charging and discharging are controlled based on this deviation such that the charge/discharge current matches the current command value. In the fourth embodiment as described above, charging or discharging for heat-up can be performed by controlling the charge/discharge current of a secondary battery. This makes it possible to avoid the generation of an overcurrent to the secondary battery, and perform charging/discharging with a large current.

Fifth Embodiment

Figure 8:
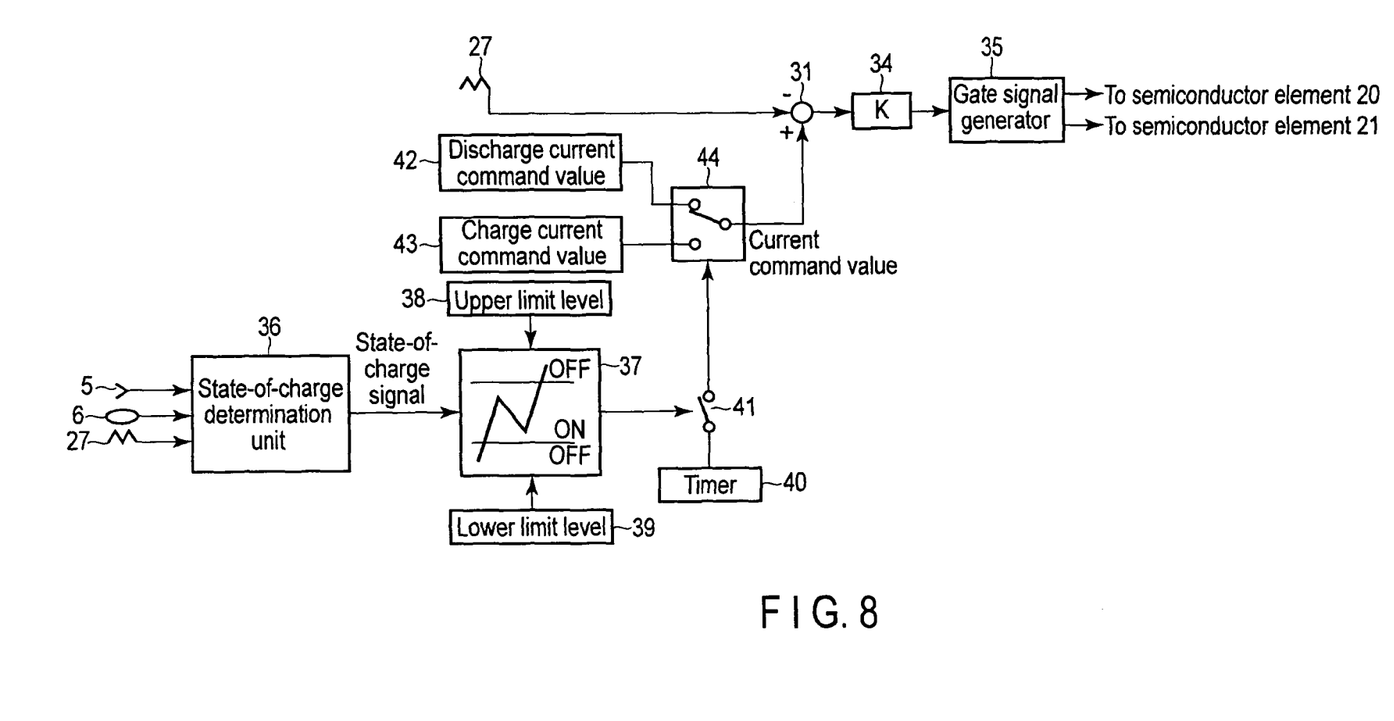
FIG. 8 is a view showing an example of the control of a charge/discharge controller according to the fifth embodiment.

The fifth embodiment has the same arrangement as that shown in FIG. 6 of the abovementioned fourth embodiment, except for the control of a charge/discharge controller 13. FIG. 8 shows an example of the control of the charge/discharge controller 13 according to the fifth embodiment. As shown in FIG. 8, the charge/discharge controller 13 includes an adder 31, a control gain 34, a gate signal generator 35 for generating gate signals for turning on and off semiconductor elements 20 and 21, a state-of-charge determination unit 36, a level determination unit 37, an upper limit level 38, a lower limit level 39, a timer 40, a switching unit 41 for turning on and off the timer 40, a discharge current command value 42, a charge current command value 43, and a switching unit 44.

When a secondary battery 2 is selected as a battery to be heated in FIG. 8, the state-of-charge determination unit 36 receives voltage information from a voltage detector 5, battery temperature information detected by a battery temperature detector 6, and current information detected by a current detector 27, determines the state of charge of the secondary battery 2, and inputs state-of-charge information to the level determination unit 37. The level determination unit 37 compares the state-of-charge information with the preset upper limit level 38 and lower limit level 39. If the state-of-charge information is lower than the upper limit level 38 and higher than the lower limit level 39, the level determination unit 37 turns on the switching unit 41 to turn on the output from the timer 40. On the other hand, if the state-of-charge information is higher than the upper limit level 38 or lower than the lower limit level 39, the level determination unit 37 turns off the switching unit 41 to turn off the output from the timer 40.

The switching unit 44 receives the discharge current command value 42 and charge current command value 43. When the signal from the timer 40 is turned on by the switching unit 41, the switching unit 44 switches signals in accordance with the timer output so as to alternately output the discharge current command value 42 and charge current command value 43 for every predetermined time. The adder 31 obtains a deviation between current information detected by the current detector 27 and the current command value, and outputs current deviation information. This current deviation information is gained by the control gain 34, and supplied to the gate signal generator 35. The gate signal generator 35 generates signals for driving the semiconductor elements 20 and 21, and outputs the signals to the semiconductor elements 20 and 21.

In the fifth embodiment as described above, when the state of charge (SOC) of a secondary battery to be heated is, e.g., 40% which is between 80% as an upper limit level of the SOC and 20% as a lower limit level of the SOC, the secondary battery is charged and discharged by alternately outputting the discharge current command value 42 (e.g., 10 A) and the charge current command value 43 (e.g., 10 A) for, e.g., every 10 sec. This makes it possible to simply heat the secondary battery by charging and discharging it without any particularly complicated charge/discharge control.

Sixth Embodiment

Figure 9:
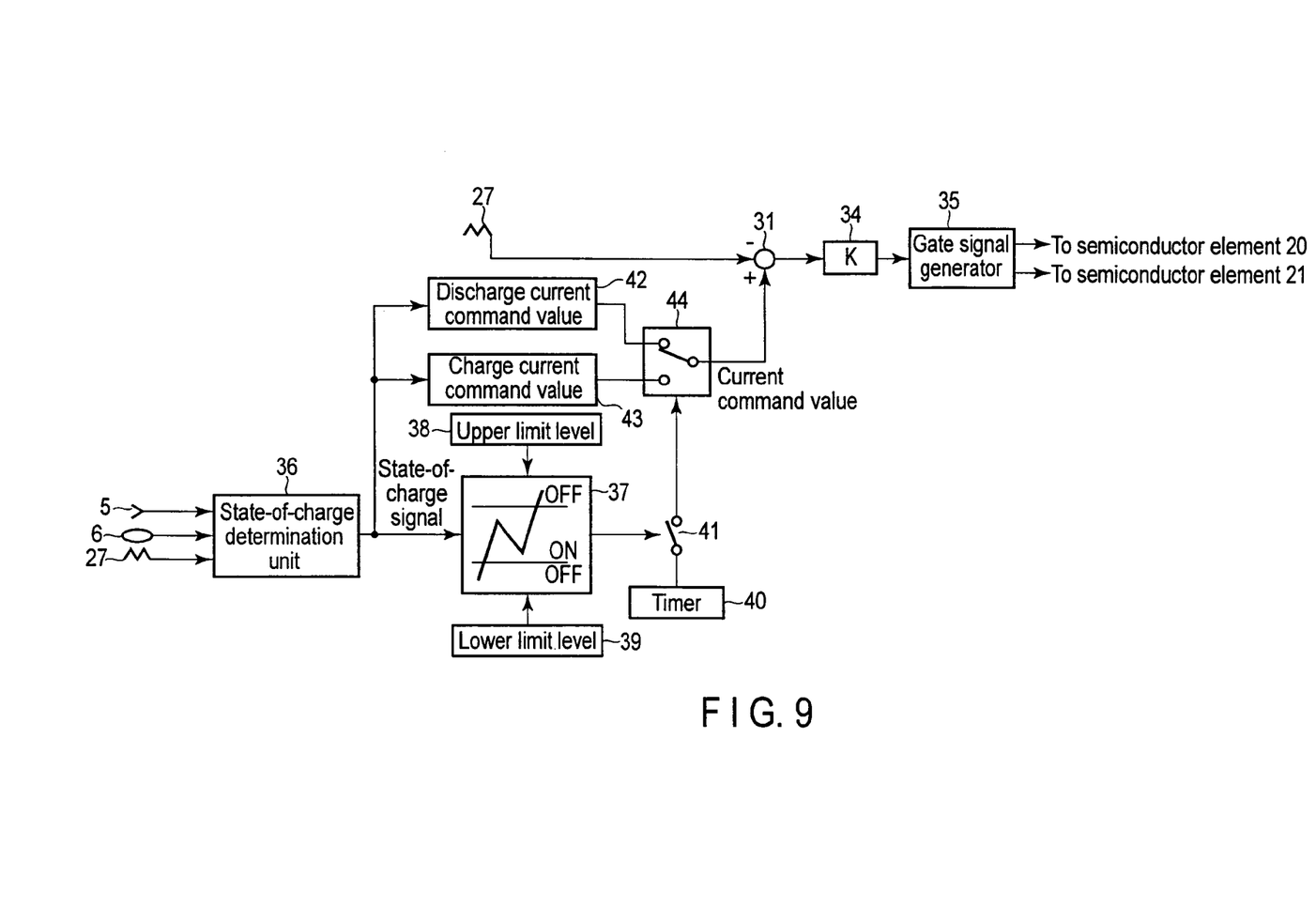
FIG. 9 is a view showing an example of the control of a charge/discharge controller according to the sixth embodiment.

FIG. 9 shows an example of the control of a charge/discharge controller 13 according to the sixth embodiment. As shown in FIG. 9, the sixth embodiment is obtained by changing the abovementioned fifth embodiment such that a discharge current command value 42 and charge current command value 43 receive state-of-charge information determined by a state-of-charge determination unit 36, and the discharge current command value 42 and charge current command value 43 are changed in accordance with the state-of-charge information.

In the sixth embodiment as described above, when the state-of-charge (SOC) of a secondary battery to be heated is, e.g., 30% which is between 80% as an upper limit level of the SCO and 20% as a lower limit level of the SOC, a discharge margin is 10% (=state of charge: 30%—lower limit level: 20%). Therefore, the discharge current command value 42 (e.g., 5 A) and the charge current command value 43 (e.g., 10 A) are alternately output for every 10 sec for a given period, thereby making the state of charge close to 50%. When the state of charge of the secondary battery becomes close to 50% to some extent, the discharge current command value 42 (e.g., 10 A) and the charge current command value 43 (e.g., 10 A) are alternately output for every 10 sec, thereby charging and discharging the secondary battery. This makes it possible to rapidly heat the secondary battery by simply charging and discharging it without any particularly complicated charge/discharge control.

Seventh Embodiment

Figure 10:
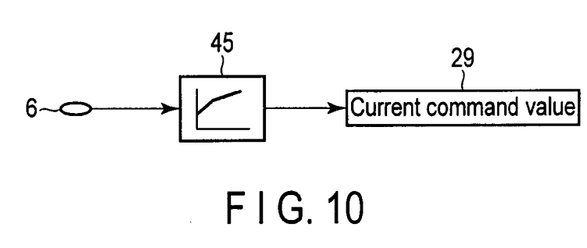
FIG. 10 is a view showing an example of the control of a charge/discharge controller according to the seventh embodiment.

FIG. 10 shows an example of the control of a charge/discharge controller 13 according to the seventh embodiment. The seventh embodiment is obtained by adding a data converter 45 to FIG. 7.

Referring to FIG. 10, when a secondary battery 2 is selected as a battery to be charged/discharged for heat-up, the data converter 45 receives battery temperature information from a battery temperature detector 6, and generates a current command value 29 from the battery temperature information.

In the seventh embodiment as described above, a charge/discharge current can be increased as a secondary battery heats up and the impedance reduces. This makes it possible to shorten the charge/discharge time by optimizing the charge/discharge current.

Eighth Embodiment

Figure 11:
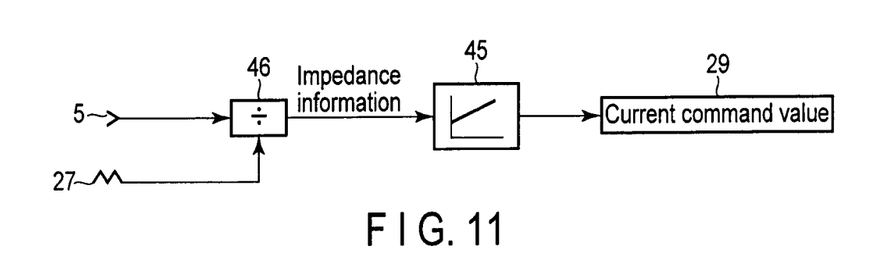
FIG. 11 is a view showing an example of the control of a charge/discharge controller according to the eighth embodiment.

FIG. 11 shows an example of the control of a charge/discharge controller 13 according to the eighth embodiment. The eighth embodiment is obtained by adding a data converter 45 and divider 46 to FIG. 7.

Referring to FIG. 11, when a secondary battery 2 is selected as a battery to be charged/discharged for heat-up, the divider 46 receives voltage information from a voltage detector 5 and current information from a current detector 27, and calculates the impedance value by dividing the voltage value by the current value. The data converter 45 receives this impedance value and generates a current command value 29 suited to the impedance value.

In the eighth embodiment as described above, a charge/discharge current suitable for the battery impedance that reduces as the battery temperature rises can be set as a current command value. This makes it possible to reduce the charge/discharge time.

Ninth Embodiment

Figure 12:
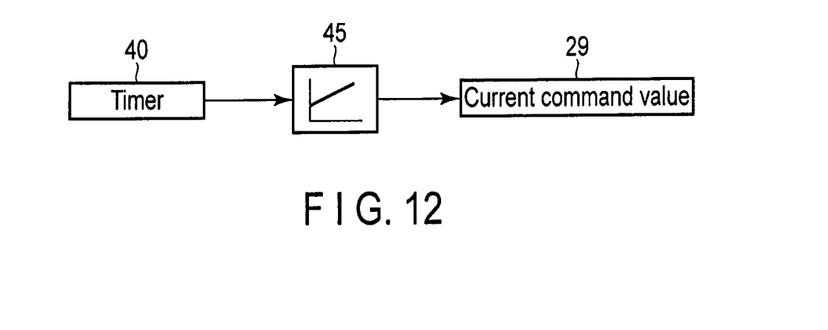
FIG. 12 is a view showing an example of the control of a charge/discharge controller according to the ninth embodiment.

FIG. 12 shows an example of the control of a charge/discharge controller 13 according to the ninth embodiment. The ninth embodiment is obtained by adding a timer 40 and data converter 45 to FIG. 7.

The data converter 45 receives time information of the timer 40 that starts at the beginning of a charge/discharge operation, and performs control so as to gradually increase a current command value 29 as the time elapses.

In the ninth embodiment as described above, the current command value can be generated by using only the elapsed time as a criterion of current generation without detecting the voltage and electric current. Accordingly, the current command value can be increased with a simple arrangement.

Although several embodiments of the present invention have been explained, these embodiments are presented as examples, and are not intended to limit the scope of the invention. These novel embodiments can be practiced in a variety of other forms, and various omissions, replacements, and changes can be made without departing from the spirit and scope of the invention. These embodiments and their modifications are included in the spirit and scope of the invention, and are also included within the range of inventions and their equivalents described in the scope of claims.

What is claimed is:

1. A battery control apparatus for controlling first and second rechargeable batteries, the apparatus comprising:
   a common bus connecting the first and second rechargeable batteries;
   a voltage detector configured to detect voltages of the first and second rechargeable batteries;
   a temperature detector configured to detect a temperature of the first and second rechargeable batteries;
   a charger/discharger configured to connect to the first and second rechargeable batteries, and charge one of the first and second rechargeable batteries by electric power discharged by the other of the first and second rechargeable batteries; and
   a controller configured to control the charger/discharger such that charging and discharging are performed between the first and second rechargeable batteries by using the charger/discharger if battery temperature information detected by the temperature detector is lower than a preset threshold temperature, wherein
   the charging is stopped and switched to discharging or pause if voltage information detected by the voltage detector reaches an upper limit voltage of the one of the first and second rechargeable batteries, and
   the discharging is stopped and switched to charging or pause if the voltage information detected by the voltage detector reaches a lower limit voltage of the other of first and second rechargeable batteries.

2. The apparatus according to claim 1, further comprising:
   a power supply unit configured to supply electric power to the first and second rechargeable batteries via the common bus; and
   a state-of-charge determination unit configured to determine a state of charge of the first and second rechargeable batteries,
   wherein if state-of-charge information determined by the state-of-charge determination unit is lower than a preset voltage threshold, the controller charges the first and second rechargeable batteries by supplying electric power from the power supply unit to the first and second rechargeable batteries.

3. The apparatus according to claim 1, further comprising:
   a power consuming unit configured to consume electric power of the first and second rechargeable batteries via the common bus; and
   a state-of-charge determination unit configured to determine a state of charge of the first and second rechargeable batteries,
   wherein if state-of-charge information determined by the state-of-charge determination unit is higher than a preset voltage threshold, the controller discharges the first and second rechargeable batteries by consuming electric power of the first and second rechargeable batteries by the power consuming unit.

4. The apparatus according to claim 1, further comprising:
   a current detector configured to detect a charge/discharge current of the first and second rechargeable batteries,
   wherein the controller performs charging/discharging based on a deviation between current information detected by the current detector and a preset current command value, such that the charge/discharge current matches the current command value.

5. The apparatus according to claim 4, further comprising:
   a state-of-charge determination unit configured to determine a state of charge of the first and second rechargeable batteries,
   wherein if state-of-charge information determined by the state-of-charge determination unit falls within a preset range, the controller repeats charging and discharging of the first and second rechargeable batteries alternately by switching the current command values for every predetermined time.

6. The apparatus according to claim 4, further comprising:
   a state-of-charge determination unit configured to determine a state of charge of the first and second rechargeable batteries,
   wherein the controller changes a magnitude of the current command value in accordance with state-of-charge information determined by the state-of-charge determination unit.

7. The apparatus according to claim 4, wherein the controller changes the current command value based on battery temperature information detected by the temperature detector.

8. The apparatus according to claim 4, wherein the controller obtains impedance information by dividing voltage information detected by the voltage detector during charging or discharging by current information detected by the current detector, and changes the current command value in accordance with the impedance information.

9. The apparatus according to claim 4, wherein the controller increases the current command value in accordance with a time elapsed from start of a charge/discharge operation.

* * * * *